(12) United States Patent
Köster et al.

(10) Patent No.: US 7,400,149 B2
(45) Date of Patent: Jul. 15, 2008

(54) METHOD FOR ASSESSMENT OF THE STATE OF BATTERIES IN BATTERY-SUPPORTED POWER SUPPLY SYSTEMS

(75) Inventors: Kay Köster, Fredersdorf (DE); Harald Walter, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 391 days.

(21) Appl. No.: 10/850,444

(22) Filed: May 21, 2004

(65) Prior Publication Data

US 2005/0007074 A1 Jan. 13, 2005

Related U.S. Application Data

(60) Provisional application No. 60/472,411, filed on May 22, 2003.

(30) Foreign Application Priority Data

Jan. 8, 2002 (DE) .............................. 102 01 136

(51) Int. Cl.
*G01N 27/42* (2006.01)

(52) U.S. Cl. .................. 324/429; 320/132; 320/134; 320/136

(58) Field of Classification Search .................. 324/429; 320/132, 134, 136
See application file for complete search history.

(56) References Cited

U.S. PATENT DOCUMENTS 4,731,601 A 3/1988 Nowakowski et al.
5,027,294 A * 6/1991 Fakruddin et al. ............ 713/300
5,182,509 A * 1/1993 Simmonds .................... 320/131
5,371,682 A * 12/1994 Levine et al. .................. 702/63
5,394,089 A 2/1995 Clegg
5,604,416 A * 2/1997 Kim ............................ 320/135
5,936,383 A * 8/1999 Ng et al. ...................... 320/132
6,057,671 A * 5/2000 Kuno .......................... 320/130
6,061,639 A * 5/2000 Wistrand ...................... 702/63
6,459,240 B2 * 10/2002 Postma ........................ 320/132

(Continued)

FOREIGN PATENT DOCUMENTS

DE 31 50 758 A1 7/1983

(Continued)

*Primary Examiner*—Adolf Berhane
*Assistant Examiner*—Samuel Berhanu
(74) *Attorney, Agent, or Firm*—Laurence A. Greenberg; Werner H. Stemer; Ralph E. Locher (57) ABSTRACT

After disconnection from the power supply system, a discharge characteristic of the no-load voltage is recorded automatically by means of a control unit across a discharge resistance during a stage-by-stage discharge cycle from a charged battery which is being operated for the first time on the power supply system. This stage-by-stage discharge cycle is repeated at times which can be defined, in order to record an instantaneous discharge characteristic of the no-load voltage, and an alarm no-load voltage is determined from the instantaneous discharge characteristic of the no-load voltage from a previously defined reserve time and from the final discharge voltage as determined in the first measurement, which alarm no-load voltage represents a measure of the energy which in each case still remains in the battery, and on reaching which during operation on the load, an alarm is produced for the operator of the power supply system.

18 Claims, 5 Drawing Sheets

U.S. PATENT DOCUMENTS

| | | | |
|---|---|---|---|
| 6,507,194 B2 * | 1/2003 | Suzuki | 324/428 |
| 6,642,719 B1 * | 11/2003 | Seto | 324/427 |
| 6,661,231 B1 * | 12/2003 | Arai et al. | 324/426 |
| 6,756,768 B2 * | 6/2004 | Okada | 320/132 |
| 6,850,036 B2 * | 2/2005 | Lin et al. | 320/127 |

FOREIGN PATENT DOCUMENTS

| | | |
|---|---|---|
| DE | 38 21 808 A2 | 1/1990 |
| DE | 39 10 868 A1 | 12/1990 |
| DE | 42 38 316 A1 | 5/1993 |
| DE | 196 05 481 C1 | 6/1997 |
| EP | 0 711 016 A2 | 5/1996 |
| EP | 1278072 * | 1/2003 |

* cited by examiner

METHOD FOR ASSESSMENT OF THE STATE OF BATTERIES IN BATTERY-SUPPORTED POWER SUPPLY SYSTEMS

CLAIM FOR PRIORITY

This application claims the benefit of priority to U.S. Provisional Application No. 60/472,411, filed in the German language on May 22, 2003, the contents of which are hereby incorporated by reference.

TECHNICAL FIELD OF THE INVENTION

The invention relates to a method for assessment of the state of batteries in battery-supported power supply systems.

BACKGROUND OF THE INVENTION

One major problem in battery-supported power supply systems is the assessment of the state of charge, of the aging and of the life expectancy of the energy store, irrespective of whether an energy store is used as an emergency battery, as a back-up battery or as a cyclically operated main battery. The need for a valid statement about the storage state of a battery must be regarded as particularly strong when the battery-supported power supplies are used for feeding systems with enhanced safety, security or availability requirements. It is particularly important to determine the battery state in the case of remote, automatically operated island systems, which generally operate without supervision and are not subject to any maintenance for lengthy time periods (weeks, months), since the effort to replace the batteries, for example in the case of maritime navigational aids, or in areas where access is difficult or there is little population, may in some cases be very high.

It is known for batteries to be continuously monitored and for the periodicities for preventative replacement procedures as specified in the operating instructions for such systems to be complied with. The batteries in the system are removed and replaced by new ones irrespective of the actual aging state of the batteries. Ideally, the old batteries are processed, with valuable substances being recycled. This procedure requires a high degree of maintenance effort. Furthermore, the increasingly economical use of resources often prevents batteries from being replaced purely as a preventative measure.

A method for calculation of the capacity balance between assumed ampere hours and emitted ampere hours is widely used. If the initial capacity is known, the no-load current drawn is determined, and the no-load voltage with respect to the capacity is assessed, it is thus possible to assess the state of charge of the battery with sufficient accuracy, particularly when temperature influences are compensated for by means of correction factors. The advantage of this method is the simple evaluation, independently of the chemical processes within the battery. Since the voltage that is produced is always at the same level as the final charge voltage in mains-powered power supply systems, this calculation is always accurate, because the battery is always fully charged when in the balanced state. However, the major disadvantage of this method becomes evident in the case of autonomous systems operated in the island mode. Even if the current detection measurement error is very small, this is integrated over time to produce a very major discrepancy from the actual values, so that the energy balance becomes highly erroneous and unusable for specific state analyses. This problem is worse, in particular in power supplies which supply loads on an event-controlled basis, that is to say in systems in which only a small amount of power is intended to be provided over a specific time period for monitoring purposes, but greater amounts of power are provided for operation of loads when an event is triggered. Furthermore, in the case of autonomous systems, it must always be assumed that the energy balance is not equalized over lengthy time periods. This problem is known, so that the measurement system and the energy store are generally recalibrated at specific times. The store is returned to the fully charged state by means of an external energy supply. However, the monitoring of the measurement system and the independence from the mains system for specific charging of the batteries involve a high degree of complexity.

Another known method relates to the measurement of the voltage at the battery terminals. This makes use of the knowledge that the voltage on a battery represents a measure of the state of charge once the chemical processes associated with charging and discharging have decayed. However, this method is dependent on the battery being removed from the system and being left in a rest state for several hours in order to achieve sufficiently accurate measurements.

Fuzzy algorithms use simulation methods to calculate the instantaneous state of charge based on charging and discharge characteristics from the battery manufacturers and measurement of the current and voltage on the battery. These methods are relatively accurate provided that the battery is operated cyclically, but are subject to errors for battery states of charge above 80%, for small charging and discharge currents and when large temperature differences occur during operation. The system calibration that is required is carried out in the same way as for systems using a current measurement.

SUMMARY OF THE INVENTION

The invention relates to a method for assessment of the state of batteries in battery-supported power supply systems having at least two parallel battery paths, which alternately supply a load with power or are recharged from a generator depending on the state of charge, for feeding any desired electrical devices such as controllers, communication devices, lamps, motors or the like.

The invention specifies, in one embodiment, a method by means of which a specific service action is taken when the energy stores are exhausted, in order to reduce the maintenance effort. The aim of the system is to make it possible to decide whether this is a temporary system state which is related to an inadequate supply of energy, or indicates the end of the life cycle. Since different capacities and voltages generally occur in different systems, the method should be suitable for assessing the batteries automatically and without inputting set values as initial variables. Furthermore, the system should be suitable for making valid statements about the availability of the energy store, independently of the load behavior in the respective system.

Accordingly, after disconnection from the power supply system, a discharge characteristic of the no-load voltage is recorded automatically by means of a control unit across a discharge resistance during a stage-by-stage discharge cycle from a charged battery which is being operated for the first time on the power supply system, this stage-by-stage discharge cycle is repeated at times which can be defined, in order to record an instantaneous discharge characteristic of the no-load voltage, and an alarm no-load voltage is determined from the instantaneous discharge characteristic of the no-load voltage from a previously defined reserve time and from the final discharge voltage as determined in the first measurement, which alarm no-load voltage represents a measure of the energy which in each case still remains in the battery, and on reaching which during operation on the load, an alarm is produced for the operator of the power supply system.

The method determines a time for deliberate replacement of the batteries. In this case, a reserve is provided for the protected power supply, to allow the operator to reach and to maintain the system within a reserve time.

The invention assumes, in this embodiment, an autonomous power supply system in an arrangement of at least two or more parallel battery paths which alternately supply the load with power or are recharged from a generator depending on the state of charge, with a voltage measurement device as well as in each case one switch with a series-connected resistor being in each case arranged in parallel with each battery. Each battery path has in each case one generator switch and one load switch.

At a suitable time, a new battery is disconnected from the load and is charged from the generator to the final charge voltage. After disconnection of the battery from the generator and after a stabilization time has passed, the terminal voltage is measured at the battery, and is stored. The battery is then discharged in stages in a first discharge cycle by operating the switch that is connected in parallel on the battery, so that the battery current flows through the resistor. The discharge is interrupted at specific times, and the voltage is measured once a waiting time has elapsed. The discharge process is then continued as described until the final discharge voltage is reached. The discharge characteristic of the no-load voltage can be modeled by storage of the voltage values plotted against the discharge time period. Once these measurements have been completed, the battery is recharged and is connected back into the power supply system.

The described discharge procedure is repeated at any desired times, which may be defined, with a simplification being feasible in which significant points of the discharge characteristic are driven to specifically. Particularly on reaching a voltage which comes close to the final discharge voltage, two or more measurement points should be recorded in order to record the precise profile of the discharge characteristic. The measurement is carried out in the same mode, that is to say using the same times both for the discharge periods and for the subsequent rest times.

The discharge voltage at which a critical system state is reached is obtained by back-calculation from the previously defined prewarning time and reserve time. At the same time, a measure for the maximum remaining energy in the power supply can be found by calculation of the area integral between the time of the start of the reserve time and the time at which the final discharge voltage is reached. Since the discharge characteristic of batteries in the area of deep discharges generally scarcely changes in comparison to the overall discharge characteristic throughout their life, this voltage value can be used for further analysis purposes.

The change in the reduction of the discharge time between battery discharges may on the one hand be used to determine the aging progress while, on the other hand, the measurement system can also use this to determine the time window between two battery discharges. This method is preferred in order to avoid unnecessary stress conditions during the battery test in comparison to presetting constant time patterns for discharge processes.

The history of the life of the battery is recorded in this way. A statement about the capacity which can still be stored in the battery and about aging can be made on the basis of the change in the voltage difference between defined measurement points and the reduction in the discharge time, as well as the change in the discharge characteristic, preferably in the area of the final discharge voltage.

On the basis of this method, a battery is regarded as being exhausted and at the end of its life cycle for the operator in a specific operational situation when discharging takes place quickly in such a way that, after switching on the fully charged battery for operation of a load, the voltage collapses to the critical discharge value (alarm no-load voltage) which characterizes the minimum amount of energy for the prewarning time or reserve time, and at which point the servicing or maintenance action is initiated, for example via remote signaling.

Typical load profiles for the system can be determined by means of current measurement in order to calculate the minimum remaining energy required for maintenance of operation in the reserve time. The integration error over time is made relative by comparison of repeatedly carried out measurements and formation of the arithmetic mean value. The integration error can be further restricted by suitable choice of the measurement time. Since the values are reset when a new measurement cycle is started, no cumulative errors occur. Typical recorded times are, for example, one day or one week. These measurements are repeated periodically. The power supply thus reacts to changes in the load behavior of the system and can carry out a correction calculation for the remaining storage content for the reserve time defined in advance by the operator.

The advantage of the method is that the state of a battery which has been disconnected from the power supply system can be tested by means of a simple voltage measurement and time control without any stringent accuracy requirements, and an analysis of its aging and life expectancy can be carried out by comparison with data from previous measurements stored in the measurement system. This avoids integration errors resulting from time-dependent measurement methods or recalibration procedures, so that fully automatic operation is feasible. Since relative variables are determined in all the analysis processes, there is no need to know the absolute capacity nor the type of battery. The behavior of the load is likewise not relevant, since the discharge test is always carried out on the same load, preferably with a constant current. In fact, it is sufficient to state the type of technology of the battery (lead-zinc, nickel-cadmium, lithium-ion battery, etc.). The system defines the final charge voltage and the final discharge voltage as well as the charging/discharge method on the basis of the battery voltage that is produced.

Furthermore, the operator of the system determines the prewarning and reserve times that are relevant for this specific operation. It is thus possible to define the selective usage duration of the energy store in each system. In principle, the definition of a reserve time for the user is sufficient to initiate a specific maintenance action. The prewarning time is used to provide the operator with service strategy options.

Advantages also result from the assessment of damage to the batteries. If the voltage in one battery path falls suddenly, the controller switches to a different battery path in order to supply the load. A comparison with the data which is stored for the battery path that is found not to be operating correctly and with possible recharging that may be carried out provides a conclusion as to whether an extraordinary event on the load has resulted in a very major discharge, for example as a result of a temporary short-circuit, or else whether there is a cell short-circuit within the battery. Since the system stores the profile of the most recent discharge characteristic, a partial discharge is sufficient to assess the battery state. If the profile of the discharge characteristic of the partial discharge that is carried out is within the narrow tolerance band around that most recently measured, then a temporary external short-circuit has occurred. If the voltage when the discharge resistor is switched on differs (severely) beyond the tolerance from the most recent discharge characteristic, a cell short-circuit may be assumed.

In addition to the described tests, further tests may be carried out. For example, it is possible to deduce the instantaneous state of charge of the battery from a single measurement of the no-load voltage. The self-discharge can be determined, as a sign of aging, by means of two voltage measurements in a time interval, by carrying out a no-load voltage test over a defined time period on a battery that has been disconnected from the power supply system.

If the load is operated for a specific time period without a generator, that is to say it is operated on the battery in one battery path, it is possible to determine the amount of energy required by the load. The time to discharge the respective battery can be calculated back from this load test. In addition, in the event of any changes to the load behavior resulting from external influences (short-circuits, heavy load, change to the battery regime), it is possible to calculate the resultant shortening of the discharge time.

In the case of power supply systems which are operated in the island mode, different strategies may be adopted for switching between charging, load supply and standby maintenance on the basis of the knowledge of the battery capacities and states of charge in the individual paths of the energy store. The control aim is to achieve or maintain the maximum energy content in the battery store. At least three basic variations of switching strategies are worthwhile, which can be decided on autonomously by means of an automatically operating controller depending on the amount of energy introduced by the generator and/or the energy consumed via the load.

A first basic variation comprises the controller switching between the battery paths for supplying the load in the time pattern of the reserve time chosen by the operator, with the generator in each case recharging the battery which was most recently connected to the load. In this case, the power supply system always remains at a high storage capacity level, with the batteries being cycled to a minor extent.

A second variation is for one battery path to be connected to the load and for this to be discharged until the critical discharge voltage as determined from the most recent discharge characteristic stored by the measurement system is reached, with this being used as a characteristic variable for the amount of reserve capacity for supplying the load. In this case, each battery path is cycled, and this invariably has an effect to promote life. However, the battery should not be operated down to the final discharge voltage since, in the event of a fault during switching to another battery path or as a result of damage in other battery paths or in the generator, there must still be at least a sufficient amount of energy to maintain operation with a typical load profile within the reserve time by switching back to the most recently discharged battery. In this variation, the generator gives charging priority to the battery that has been discharged to the greatest extent.

The third option is control of a pure standby mode. For this purpose, the generator and one battery path supply the load. The other battery paths remain charged and available. Furthermore, each path is recharged in order to compensate for the self-discharge by cyclic switching of the generator to another battery path in order to supply the load. Since this variation generally equalizes the daily energy balance, it is possible to assume that an energy store will be virtually completely charged. Although this state is the most desirable, the side effects of fully charged batteries, depending on the chemical type, must be borne in mind, since it is also possible to shorten their life.

Since none of the methods described above is suitable as such for optimally operating the battery paths, the control system may if required switch cyclically between these methods on the basis of the discharge characteristics of the individual battery paths as determined by the measurement system, their states of charge and the energy available, with the aim of making use of the maximum life of the energy stores.

Additional approaches are applicable to autonomous power supply systems with a photovoltaic generator, that is to say in which energy is obtained on a randomly distributed basis. In addition to the control algorithms for the battery and load as well as the definition of the tests by battery discharging of individual paths in the energy store, another problem that occurs here is that it is not always possible for the photovoltaic generator to provide sufficient energy for continuous operation of the system. The main object is to define the time periods in which a battery test may be carried out while, on the other hand, also ensuring that the discharged battery can be recharged again as quickly as possible in the sense of maintaining the overall functionality of the power supply.

For this purpose, the daily daylight/nighttime periods are determined, and the average daily sunlight is calculated, by measurement of the voltage at the photovoltaic generator. The daily difference in the daylight time between two days is likewise stored by the measurement system. In the ideal case, the daylight hours at the respective location at which the system is installed will be identified by means of these measurement points after six months, or at the latest after nine months, and will be stored as the basis for generator operation. After identification of the daylight hours, the power supply system operates in its own relative time frame, whose corner points are formed by the solstices and the shortest and longest periods of daylight within one period. The storage of calendars or real times is of only secondary importance for the operation of the power supply at the latest after identification of the daylight hours, and may possibly be required only for comparison purposes for status messages to be sent. The advantage of this relative time system based on the astronomical behavior of the sun precludes all irregularities in calendar or real-time definitions (leap year, summertime/wintertime). There is likewise no need to install a precision timer or to transfer information relating to time information for time synchronization with the outside world. The internal timer is reset and synchronized at the respective time that is determined to be half way through the nighttime period between two days. Errors thus remain limited to a defined time period. The clock time accuracy requirements are low. All that is necessary is to choose the stability of the clock time such that the difference between the periods of daylight hours in the region of the solstice remains greater than the internal timer error.

Knowledge of the daylight hours throughout the year is used primarily to define time windows for carrying out discharge tests on the battery paths. No tests are carried out in the time period of the winter solstice (start of winter). In fact, all the available energy is recovered for the purpose of maintenance of operation of the power supply and to ensure that the state of charge of the batteries is as high as possible. In the time period of the winter solstice, the energy balance is generally negative over certain time periods, and the capacity losses which occur in the energy store are compensated for owing to the low temperatures that can be expected. The time period of the summer solstice (start of summer) is likewise critical, since high temperatures can be expected in this time period. When the temperatures are high, most electrochemical energy converters have a very sensitive reaction to charging currents, which often leads to overcharging and can significantly shorten the life of the batteries. For this reason, an optimum point for carrying out the battery tests is chosen to be a period between the solstices.

The second derivative of a curve of the annual daylight hours is ideally used to determine the point of inflection in the rise. However, in the simplest case, it is sufficient to use the area of the daylight hours curve in which the difference between the daylight times is the same. Times in the period of the start of spring and autumn additionally generally provide a correction. The correction of an advantageous discharge time for battery tests should be before these points of inflection, so that the discharged battery is charged at the time of the start of spring, or else in particular at the start of autumn. Particularly in periods where the daylight hours are decreasing, the reduction in the solar radiation can unnecessarily lengthen the charging time and restrict the availability of charged energy stores.

The procedure for definition of test time periods is simplified if information relating to the real time can be transmitted. The battery tests can likewise be inhibited or enabled by synchronization of the actual time to the internal time as determined by the system on the basis of the astronomical hours of daylight.

The functional procedures in a power supply which operates in island mode with a photovoltaic generator can be described in the following sequence:

- initial use of the power supply preferably with (at least one) charged battery;
- supply of the load on a constant switching cycle between the battery paths;
- start of the measurements of the energy consumption by the load;
- at the same time, start of the measurements of the daytime/nighttime hours;
- after at least six months, identification of the typical energy requirements of the load and of the annual daylight hours;
- initiation of a first battery test by disconnection from the system in the period in which the sunlight hours are increasing (spring), recording of a first discharge characteristic with a relatively large number of measurement points;
- calculation of the critical voltage on the battery in order to ensure a remaining capacity for maintenance of operation in a reserve time that is defined by the operator;
- recharging of the tested battery and reconnection to the power supply system;
- if required, initiation of further tests with other batteries;
- operation of the system in the time period of the summer solstice, preferably in operation with major cycling;
- in the time period of the autumn equinox, initiation of battery tests with only a small number of significant measurement points, definition of the difference between the first discharge and the discharge that has just taken place;
- recharging of the tested battery and connection back into the power supply system; and
- operation of the system in the time period of the winter solstice preferably in the standby mode, and/or such that all of the battery paths are as fully charged as possible.

This technique for operation and testing makes it possible to determine how the battery has withstood the six-month period during the winter and to check whether it will still provide sufficient capacity after the summer to survive winter operation. The change in the difference between the discharge times makes it possible, as described, to make a statement on the progress of the aging process.

The functional procedures in the tests and the determination of the daylight hours and the recording of the measured data are controlled by a computer. The appropriate software, which represents the method according to the invention can be stored in a processor or in other suitable storage media.

BRIEF DESCRIPTION OF THE DRAWINGS

The invention will be explained in more detail in the following text with reference to exemplary embodiments. In the associated drawings.

DETAILED DESCRIPTION OF THE INVENTION

Figure 1:
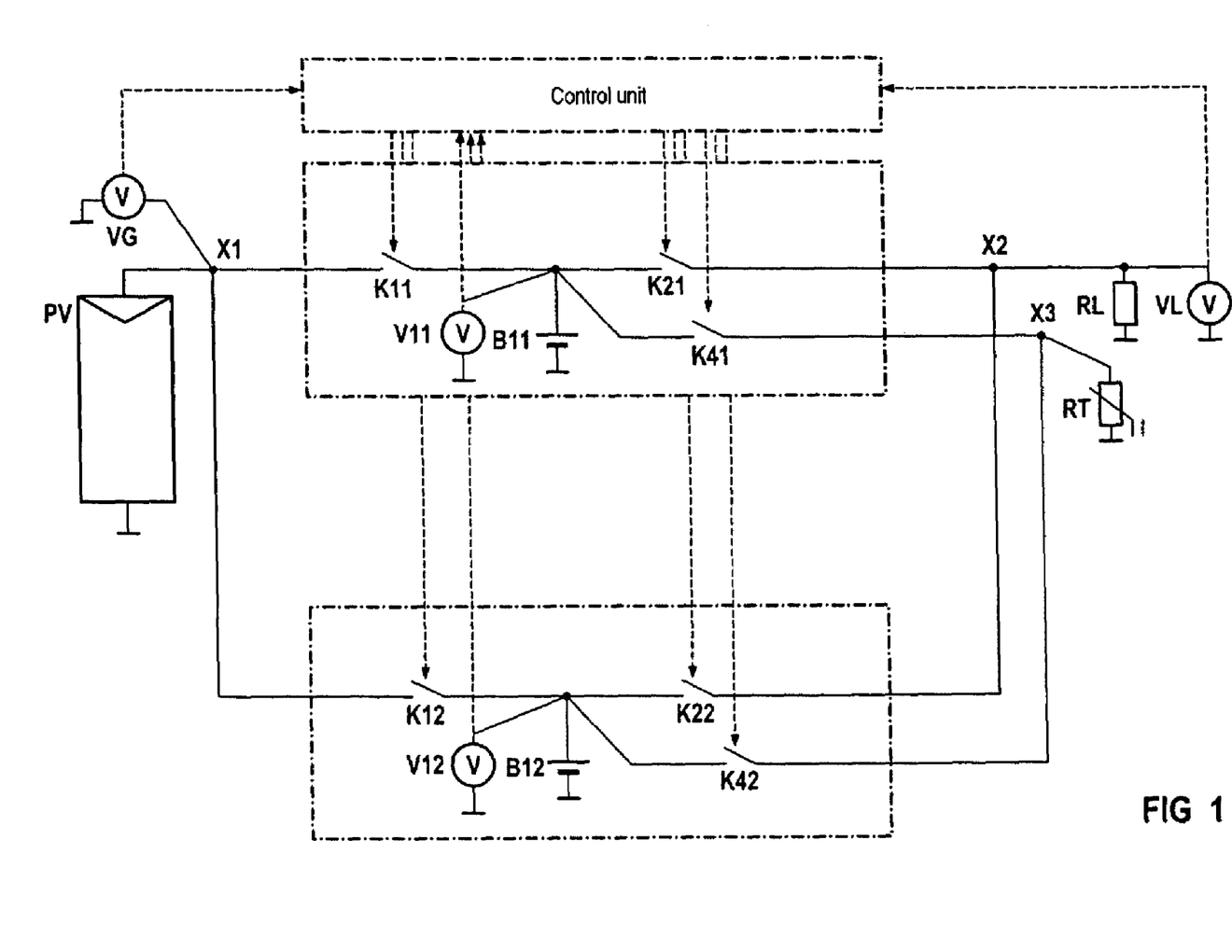
FIG. 1 shows a circuit diagram of a power supply system having two battery paths.

The exemplary embodiment relates to a power supply system having two parallel battery paths with the batteries B11 and B12, which are subjected to charging and discharge cycles in the long term and are recharged by a photovoltaic generator PV, with a respective voltage measurement device V11, V12 as well as a respective switch K41, K42 with a series-connected test resistor RT in each case being arranged parallel with each battery B11, B12. Each battery path has a respective generator switch K11, K12 and a respective load switch K21, K22 for connection to a load RL. At the generator end, the voltage can be determined by a voltage measurement device VG, and at the load end RL, it can be determined by a voltage measurement device VL.

According to the method, a test is carried out on the individual batteries B11, B12, or battery paths, removed from the power supply system. The method relates to an automated algorithm for determining parameters relating to the instantaneous state of the batteries B11, B12 and for determining the aging and remaining life by comparison with data that is stored in a measurement system.

Figures 2, 2A:
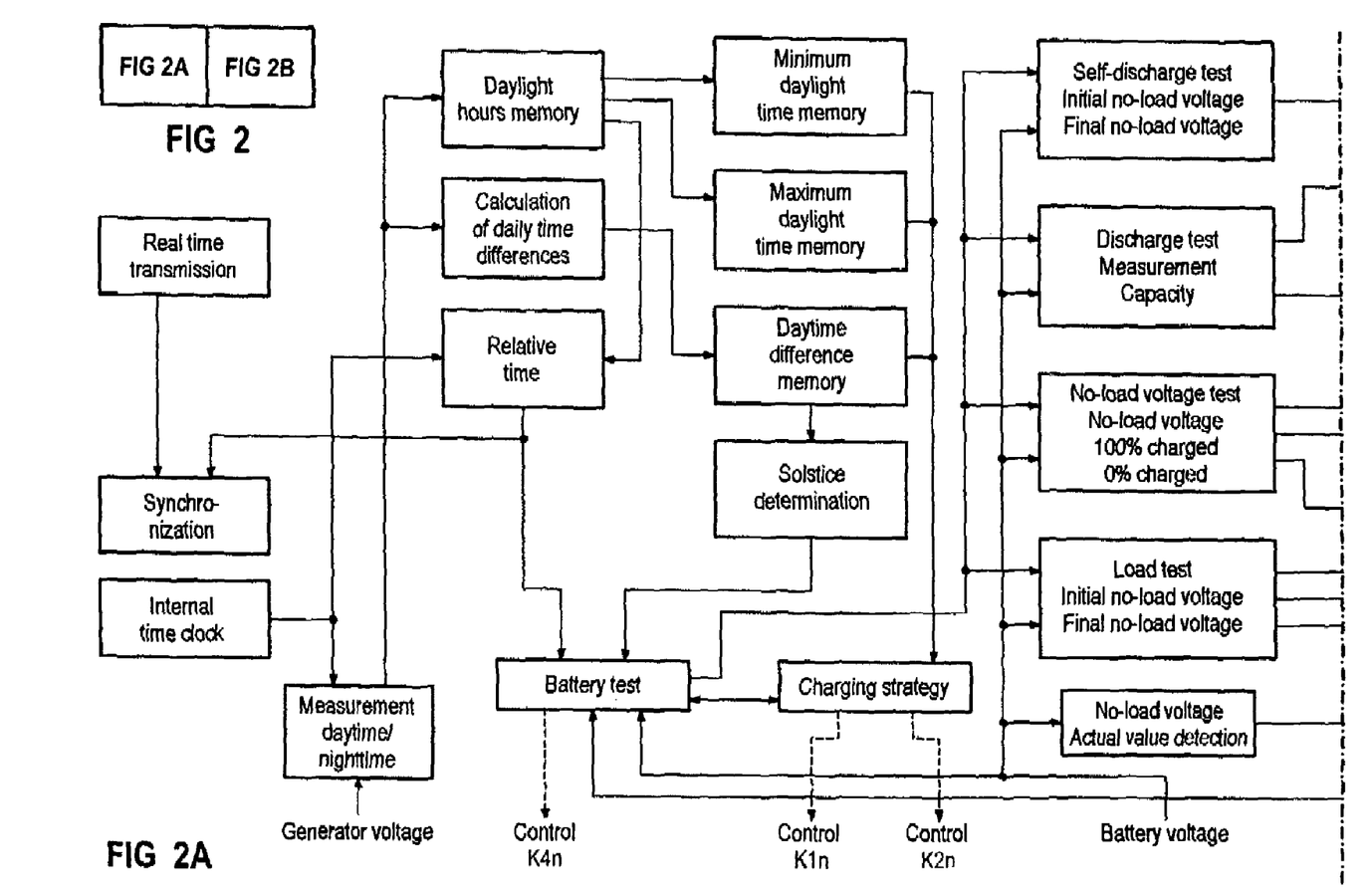
FIG. 2 shows a function plan to illustrate the method according to the invention.
Figure 2B:
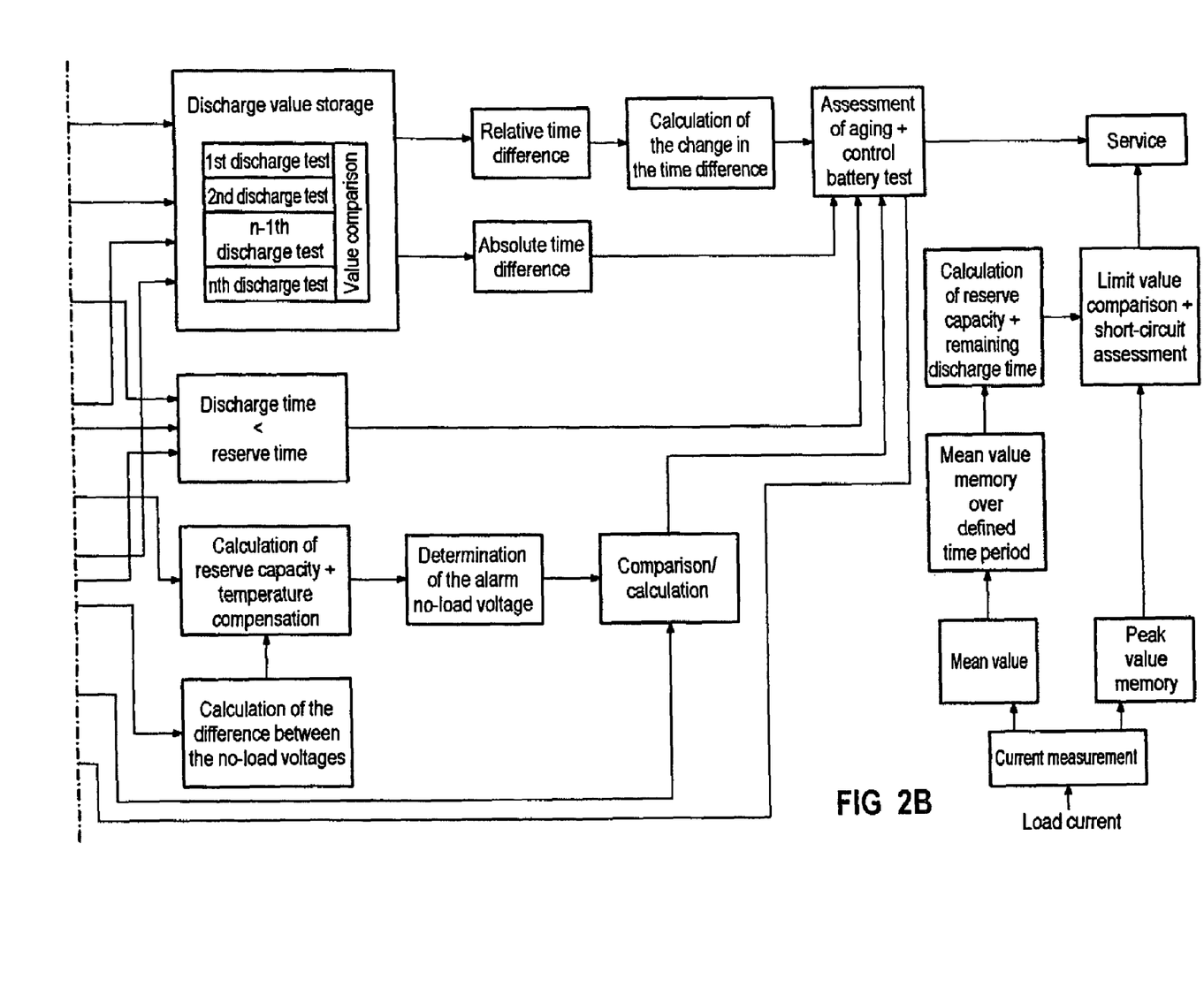

The algorithm essentially comprises two complex elements, which are illustrated in FIG. 2, irrespective of whether the power supplies are operated from the mains system or in the island mode.

The first complex relates to the calculation of the behavior of the load in order to determine an average capacity which a battery B11, B12 must provide in order to maintain its supply over a remaining availability time period as defined by the user. The load current on a battery B11, B12 which has been disconnected from the generator PV is measured for this purpose, the respective peak value is stored, and the mean value is formed over a time period (day, week, month) of the load current. The necessary remaining capacity of the battery B11, B12 is obtained by definition of the time for the remaining availability of the power supply.

The peak current measurement is used to distinguish between normal operation and an overload or short-circuit, while the determined remaining capacity is used as a measure for the latest switching time to another battery path or to trigger an alarm message.

The second complex relates to the measurement of a characteristic against time for a battery B11, B12 which has been removed from the power supply system and which has been discharged in a defined manner down to a final discharge voltage U0% on a test resistor RT. The adequate measure of the remaining capacity is determined from the determination of the average load current to maintain the power supply (first complex), by calculating the area integral between the discharge voltage profile and the time axis. The time interval at the level of the reserve time is calculated back from the time at which the final discharge voltage U0% is reached.

The voltage which is referred to as the critical discharge voltage and which is used as a measure of the available remaining energy is then obtained by interpolation between the measurement values. The discharge time is stored as an absolute value and is compared with subsequent discharge tests, with both the difference between the discharge times and the change in the difference between the discharge times being recorded. The difference in the times between two successive discharges is a measure of the aging (capacity loss), which can be related to the first discharge time. The comparison of the differences between the discharge times allows a direct preview of the operational capability of the battery B11, B12 until the next discharge.

The step of distinguishing between a battery at the end of the life cycle and a battery which is also not yet fully charged for whatever reasons is characterized in that, when a battery such as this is connected to the load, the voltage collapses such that the magnitude of the critical discharge voltage (alarm no-load voltage) is reached. If a battery such as this is recharged and is partially discharged across the test resistor RT, damage and/or the end of the life cycle can be determined on the basis of the voltage behavior of the battery if the voltage once again collapses below the value of the critical voltage, but on the other hand an insufficient state of charge is present. For this purpose, the comparison is carried out with the discharge characteristic stored in the measurement system from the most recent storage test.

Since parameters relating to the load behavior are also taken into account, the life of the energy store can be assessed selectively for each power supply system. The complete dynamic response of the change in the capacity of batteries can thus be made use of in the areas intended by the user, and the maintenance requirement can be minimized.

In the case of island network systems with a photovoltaic generator as in the example described here, it is necessary to define the times at which the batteries may be tested.

In power supplies such as these, the method comprises the actual daylight hours at the respective location at which the system is installed being determined, by measurement of the daytime/nighttime periods and storage of the daylight time differences over the course of the day, thus forming a relative time base independently of calendar discrepancies for the internal control procedures. Furthermore, the differences between the daily daylight hours are assessed in order to determine the time period in which it is worthwhile carrying out battery tests.

The next step is to define the respective best charging strategy for the energy store on the basis of the determined daylight hours. Account is therefore taken of the various criteria based on maintenance of a high-availability system state. The charging strategies relate to three basic variants; a first which is based on switching between the battery paths on a constant time pattern, a second in which one battery path supplies the load RL until the critical discharge voltage is reached, while the generator PV recharges the other battery paths, and a third in which the generator PV and one battery path are connected directly to the load RL, while the other battery paths are kept in a standby state, in the charged state.

A further step is to carry out a time synchronization process between the relative system time and real time parameters which may possibly be transmitted, in order to output sensible status messages relating to the state of the system, or to verify the decision on possible battery tests.

Figure 3:
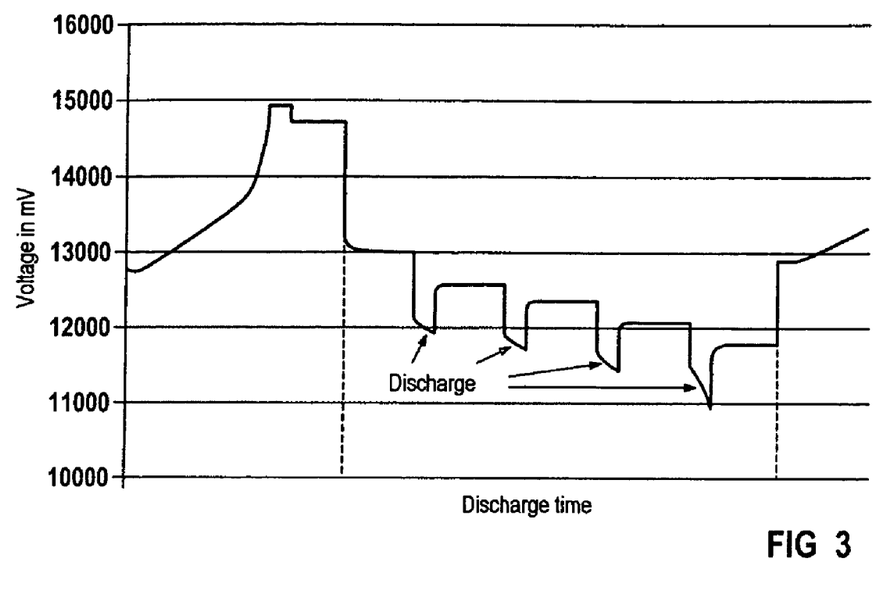
FIG. 3 shows a measurement curve for recording an instantaneous discharge characteristic of the no-load voltage by means of stage-by-stage discharging.
Figure 4:
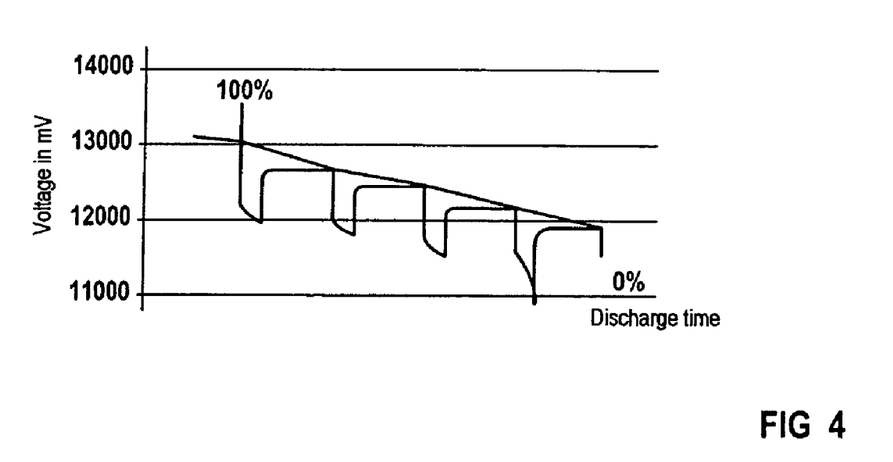
FIG. 4 shows the determined no-load voltage curve.

FIG. 3 shows the profile of the stage-by-stage discharging of a battery B11, B12 which has been removed from the power supply system. This clearly shows the discharge voltage and the rise in the battery voltage to the no-load voltage level after disconnection of the test resistor RT. One characteristic of the discharge behavior is the non-linearity of the discharge curve, with the no-load voltage characteristic having an approximately linear characteristic, to a good approximation. This no-load voltage characteristic is produced through the points with the same rest time after the discharge has been switched off (FIG. 4).

Figure 5:
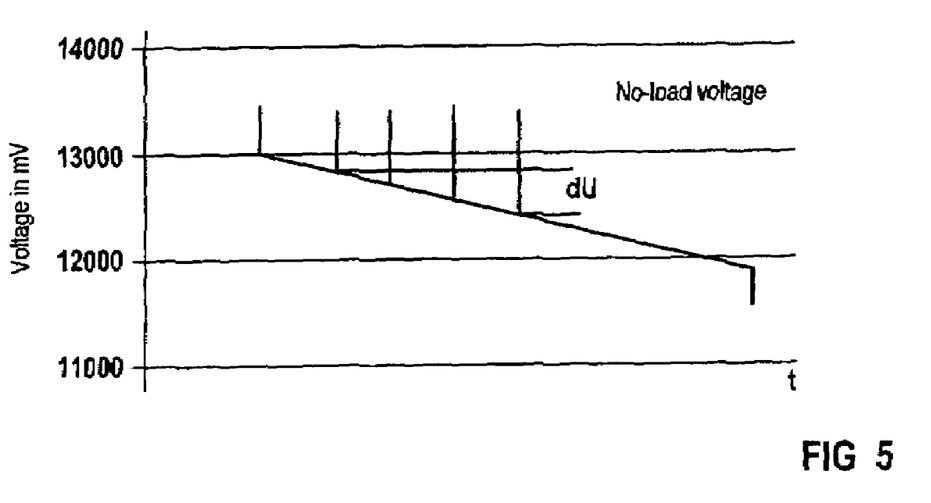
FIG. 5 shows the determination of the voltage difference on the no-load voltage characteristic between measurement points while discharging a battery connected to the load.

In order to determine the remaining capacity required for the supply to the load RL in the reserve time, the battery B11 or B12 is disconnected from the generator PV, and the no-load voltage is measured once the stabilization time has elapsed (FIG. 5). This is then followed by the battery paths being switched such that the battery B11 or B12 which was disconnected from the generator PV and is in the rest state supplies the load RL. After defined, preferably identical, time periods, this battery B11 or B12 is disconnected from the load RL, the stabilization time to reach the no-load voltage is allowed to pass, and the difference is determined between the no-load voltage and that of the previous measurement point. Repeating this measurement procedure results in the voltage differences which represent a measure of the capacity required to supply the load RL from the battery B11, B12 within a specific time. In this way, the percentage measure of the necessary remaining energy to maintain the power supply can be assessed directly, particularly when the voltage difference dU has been measured for a time period of the same magnitude as the reserve time, as is shown in FIG. 5.

Figure 6:
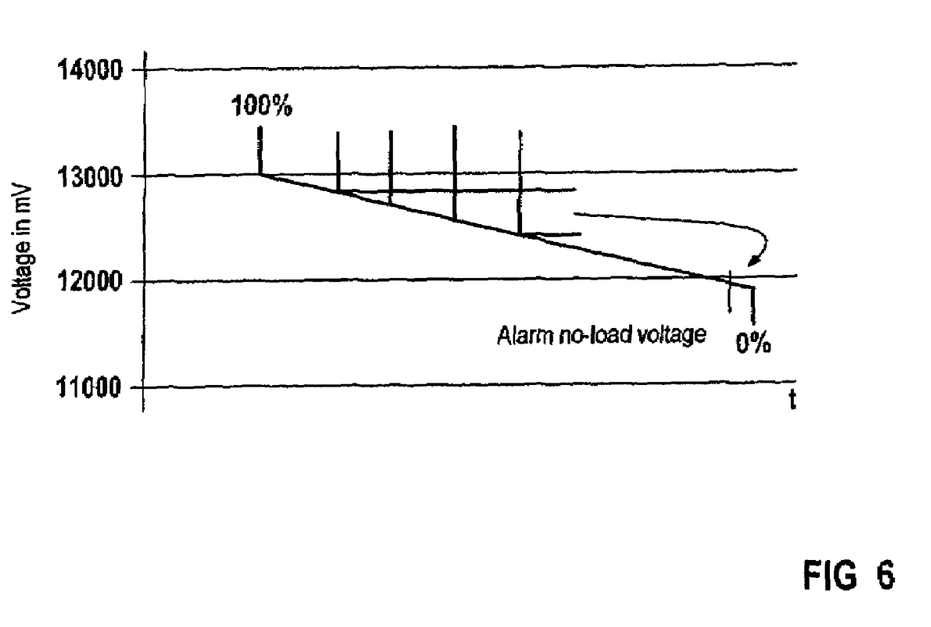
FIG. 6 shows the definition of the alarm no-load voltage on the no-load voltage characteristic.

The alarm no-load voltage can be calculated with the aid of the voltage difference dU when identifying the critical voltage level for the available remaining energy, as is shown in FIG. 6. For the general case:

$$\text{alarm no-load voltage} = U0\% + dU \times \frac{\text{reserve time}}{\text{load test time}}$$

This critical discharge voltage of the battery B11, B12 must at least also be corrected by a temperature compensation for actual operating conditions. An additional safety factor takes account of the loss of capacity in the battery B11, B12 at low temperatures. This factor is always unity for temperatures above 0° C. This factor is increased below 0° C. The factor is increased on the basis of details from the manufacturer or by evaluation of experimental measurements.

$$\text{Alarm no-load voltage} = U0\% + dU \times \frac{\text{reserve time}}{\text{load test time}} \times \text{safety factor} + \text{temperature offset}$$

$$\text{Temperature offset} = (U100\% - U0\%) \times (\text{temperature factor} - 1)$$

The temperature factor is stored in a table in the measurement system.

The safety factor can be integrated in the reserve time, or may be stated separately.

This calculation method shows that the alarm no-load voltage is recalculated.

The described method allows a safe remaining availability to be determined for the energy store and allows an autonomous power supply to be operated deliberately, corresponding to the respective load behavior, until the end of the life cycle of the battery.

What is claimed is:

1. A method for assessment of a state of batteries in battery-supported power supply systems having at least two parallel battery paths, which alternately supply a load with power or are recharged from a generator depending on the state of charge, comprising:
   after disconnection from the power supply system, automatically recording a discharge characteristic of a no-load voltage by means of a control unit across a discharge resistance during a stage-by-stage discharge cycle from a charged battery which is being operated for a first time on the power supply system;
   repeating the stage-by-stage discharge cycle at times which can be defined to record an instantaneous discharge characteristic of the no-load voltage; and
   determining an alarm no-load voltage from the instantaneous discharge characteristic of the no-load voltage from a previously defined reserve time and from a final discharge voltage as determined in the first measurement, which alarm no-load voltage represents a measure of energy which remains in the battery, and on reaching which during operation on the load, an alarm is produced for an operator of the power supply system, wherein instantaneous discharge characteristics of the no-load voltage during recharging by photovoltaic systems are recorded in a time window, which can be defined, in the area of sufficiently high solar radiation.

2. The method as claimed in claim 1, wherein individual significant points on the discharge characteristic are driven to during the measurement of the instantaneous discharge characteristic of the no-load voltage.

3. The method as claimed in claim 1, wherein at least the most recently recorded instantaneous discharge characteristic of the no-load voltage is stored.

4. The method as claimed in claim 3, wherein the time for recording the next instantaneous discharge characteristic is determined from the reduction in the discharge time between successive battery discharges.

5. The method as claimed in claim 3, wherein the remaining availability of a battery is determined from a reduction in the discharge time between successive battery discharges.

6. The method as claimed in claim 1, wherein in addition to the reserve time, an additional prewarning time is determined using the same mode as for the reserve time.

7. The method as claimed in claim 3, wherein once a defined discharge current has been exceeded during normal operation of the battery, an instantaneous discharge characteristic for the no-load voltage is recorded, and the battery is taken out of use if there is any discrepancy from the most recently recorded, stored discharge characteristic of the no-load voltage beyond defined values.

8. The method as claimed in claim 1, wherein a mean value of the discharge current is determined at the load, and a remaining capacity of the battery is determined therefrom and from the defined reserve time for the remaining availability of the power supply, from which the alarm no-load voltage is corrected based on the discharge voltage profile until the final charge voltage is reached.

9. The method as claimed in claim 1, wherein the profile of the no-load voltage is measured using the load within a time period which can be determined, and the alarm no-load voltage is corrected therefrom and from the defined reserve time for the remaining availability of the power supply, and from the final charge voltage.

10. The method as claimed in claim 1, wherein a value which is dependent on the instantaneous temperature is added to the determined instantaneous alarm no-load voltage.

11. The method as claimed in claim 1, wherein in an island mode, the batteries are connected to the load in a chosen time pattern, and the battery which was in each case connected to the load most recently is recharged.

12. The method as claimed in claim 1, wherein in an island mode, the battery which is connected to the load is in each case discharged down to its alarm no-load voltage, and the battery which is most heavily discharged is in each case recharged.

13. The method as claimed in claim 1, wherein in an island mode, the batteries are charged cyclically in the standby mode.

14. The method as claimed in claims 11, wherein cyclic switching takes place between the charging/discharge method.

15. The method as claimed in claim 1, wherein the time basis for the time window is determined as a relative time basis, which is independent of the actual time, by measurement of the daily daytime/nighttime hours and also the change therein from the power supply system itself.

16. An arrangement having a processor, comprising at least two parallel battery paths, which alternately supply a load with power or are recharged by a generator depending on a state of charge, wherein after disconnection from the power supply system, a discharge characteristic of a no-load voltage is recorded across a discharge resistance during a stage-by-stage discharge cycle from a charged battery which is being operated for a first time on the power supply system,
   the stage-by-stage discharge cycle repeated at times which can be defined in order to record an instantaneous discharge characteristic of the no-load voltage, and
   an alarm no-load voltage is determined from the instantaneous discharge characteristic of the no-load voltage from a previously defined reserve time and from a final discharge voltage as determined in a first measurement, which alarm no-load voltage represents a measure of energy which in each case still remains in the battery, and on reaching which during operation on the load, an alarm is produced for the operator of the power supply system, wherein
   instantaneous discharge characteristics of the no-load voltage during recharging by photovoltaic systems are recorded in a time window, which can be defined, in the area of sufficiently high solar radiation.

17. A computer program product, which has a computer-readable medium, on which a program is stored, and in conjunction with at least two parallel battery paths, which alternately supply a load with power or are recharged by a generator depending on the state of charge, comprising:
   after disconnection from the power supply system, recording a discharge characteristic of the no-load voltage across a discharge resistance during a stage-by-stage discharge cycle from a charged battery which is being operated for a first time on the power supply system, wherein the stage-by-stage discharge cycle is repeated at times which can be defined in order to record an instantaneous discharge characteristic of the no-load voltage; and determining an alarm no-load voltage from the instantaneous discharge characteristic of the no-load voltage from a previously defined reserve time and from a final discharge voltage as determined in a first measurement, which alarm no-load voltage represents a measure of energy which in each case still remains in the battery, and on reaching which during operation on the load, an alarm is produced for the operator of the power supply system, wherein instantaneous discharge characteristics of the no-load voltage during recharging by photovoltaic systems are recorded in a time window, which can be defined, in the area of sufficiently high solar radiation.

18. A computer-readable memory medium which is loaded into a memory of a computer, performs the following in conjunction with a battery-supported power supply system having at least two parallel battery paths, which alternately supply a load with power or are recharged by a generator depending on the state of charge, comprising:

after disconnection from the power supply system, a discharge characteristic of a no-load voltage is recorded across a discharge resistance during a stage-by-stage discharge cycle from a charged battery which is being operated for a first time on the power supply system, wherein the stage-by-stage discharge cycle is repeated at times which can be defined in order to record an instantaneous discharge characteristic of the no-load voltage; and determining an alarm no-load voltage from the instantaneous discharge characteristic of the no-load voltage from a previously defined reserve time and from a final discharge voltage as determined in a first measurement, which alarm no-load voltage represents a measure of energy which in each case still remains in the battery, and on reaching which during operation on the load, an alarm is produced for the operator of the power supply system, wherein instantaneous discharge characteristics of the no-load voltage during recharging by photovoltaic systems are recorded in a time window, which can be defined, in the area of sufficiently high solar radiation.

* * * * *